//  US007599233B2

United States Patent
Kang

(10) Patent No.: US 7,599,233 B2
(45) Date of Patent: Oct. 6, 2009

(54) RFID DEVICE HAVING NONVOLATILE FERROELECTRIC MEMORY DEVICE

(75) Inventor: Hee Bok Kang, Cheongju-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 473 days.

(21) Appl. No.: 11/646,325

(22) Filed: Dec. 28, 2006

(65) Prior Publication Data

US 2007/0247926 A1    Oct. 25, 2007

(30) Foreign Application Priority Data

Apr. 21, 2006    (KR) ............... 10-2006-0036276

(51) Int. Cl.
*G11C 7/00*    (2006.01)
(52) U.S. Cl. ........................... 365/192; 365/145
(58) Field of Classification Search ........... 365/145, 365/149, 163, 164, 177, 195, 192; 369/126; 428/700; 438/275, 3; 713/340; 257/295, 257/296, 40, 415, 734, 84; 711/115, 156; 340/10.1–10.6
See application file for complete search history.

(56) References Cited

U.S. PATENT DOCUMENTS

| 5,881,000 | A | 3/1999 | Maeda |
| 6,201,731 | B1* | 3/2001 | Kamp et al. ........... 365/185.02 |
| 6,438,020 | B1 | 8/2002 | Yamada |
| 2003/0183699 | A1* | 10/2003 | Masui ....................... 235/492 |
| 2005/0057957 | A1* | 3/2005 | Masui ....................... 365/145 |
| 2006/0114740 | A1* | 6/2006 | Watanabe .............. 365/230.06 |

\* cited by examiner

*Primary Examiner*—Richard Elms
*Assistant Examiner*—Harry W Byrne
(74) *Attorney, Agent, or Firm*—Finnegan, Henderson, Farabow, Garrett & Dunner, L.L.P.

(57) ABSTRACT

An RFID device is provided to perform a pumping operation when a read or write operation of a memory cell is performed to reduce current consumption. The RFID device includes an analog block, a digital block, and a memory block including at least one ferroelectric capacitor, and a voltage pumping unit for supplying the memory cell a pumping voltage higher than a power voltage only when the memory cell is operated.

23 Claims, 4 Drawing Sheets

RFID DEVICE HAVING NONVOLATILE FERROELECTRIC MEMORY DEVICE

RELATED APPLICATION

This application is based upon and claims the benefit of priority to Korean Application No. 10-2006-0036276, filed on Apr. 21, 2006, the entire contents of which are incorporated herein by reference.

BACKGROUND

1. Technical Field

The present invention generally relates to a voltage pumping circuit of a Radio Frequency Identification (hereinafter, referred to as "RFID") device, and more specifically, to a technology of supplying a pumping voltage only when a read or write operation of a memory cell is performed in a memory block of an RFID to reduce current consumption.

2. Description of Related Art

Ferroelectric random access memory (hereinafter, referred to as 'FeRAM') devices have attracted considerable attention as next generation memory devices because FeRAMs have a data processing speed as fast as a conventional Dynamic Random Access Memory (hereinafter, referred to as 'DRAM'), with the added benefit that FeRAM devices can retain data even after the power is no longer supplied to the memory device.

An FeRAM having a structure similar to that of a DRAM includes capacitors made of a ferroelectric substance, having a high residual polarization allowing for data retention after power is no longer supplied to the memory device.

Meanwhile, a general RFID device comprises an analog block, a digital block and a memory block.

The RFID device is operated by a power source which supplies power to the device via a transmission received by an antenna. However, as the distance between the power source and the antenna becomes greater, the received power decreases. As a result, each circuit of the RFID device is required to have relatively low power consumption.

A memory cell requires a pumping voltage only when data are read or written. However, a conventional RFID device supplies the pumping voltage to the memory block continuously when the memory cell does not perform a read or write operation.

That is, the conventional RFID device boosts a power voltage received with the use of a voltage multiplier such as a voltage doubler located in an analog block, and supplies the pumping voltage continuously to the memory block regardless of whether the memory cell is actively writing or reading data. As a result, conventional RFID devices exhibit unnecessary current and power consumption that increases with an oscillation operation of the voltage multiplier.

SUMMARY

Various embodiments consistent with the present invention are directed at providing an RFID device configured to supply a pumping voltage only when a read or write operation of a memory cell is performed in a memory block, thereby reducing current consumption.

Consistent with an embodiment of the present invention, an RFID device includes an analog block configured to receive a radio frequency signal to output an operation command signal, the radio frequency signal supplying a power voltage having a power voltage level, a digital block configured to generate an address and an operating control signal in response to the operation command signal received from the analog block, and output a response signal corresponding to the operating control signal to the analog block, and a memory block including at least one ferroelectric capacitor, the memory block configured to receive the operating control signal to generate an internal control signal and store data in a memory cell in response to the internal control signal. The memory block includes a voltage pumping unit configured to supply a pumping voltage higher than the power voltage level to the memory cell when the memory cell is operated.

BRIEF DESCRIPTION OF THE DRAWINGS

The aspects and advantages of the present invention will become apparent upon reading the following detailed description and upon reference to the drawings in which.

DETAILED DESCRIPTION

The present invention will be described in detail with reference to the accompanying drawings.

Figure 1:
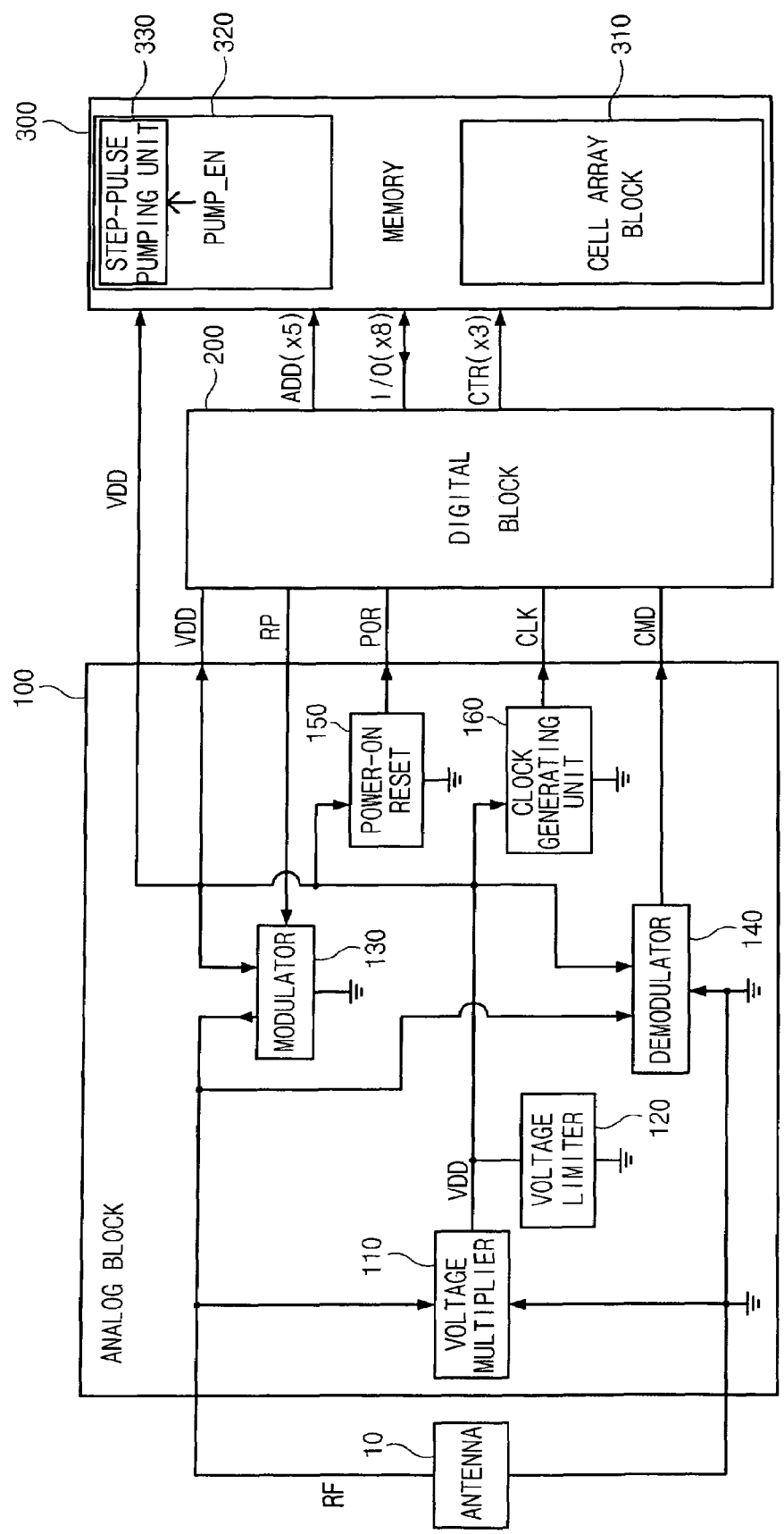
FIG. 1 is a diagram illustrating an RFID (Radio Frequency Identification) device consistent with an embodiment of the present invention.

FIG. 1 is a diagram illustrating an RFID device consistent with an embodiment of the present invention.

The RFID device includes an antenna 10, an analog block 100, a digital block 200, and a memory block 300.

Antenna 10 transmits radio frequency signals to and receives radio frequency signals from an external reader, or receives radio frequency signals from an external writer.

Analog block 100 includes a voltage multiplier 110, a voltage limiter 120, a modulator 130, a demodulator 140, a power-on reset unit 150, and a clock generating unit 160.

Voltage multiplier 110 generates a power voltage VDD which acts as a driving voltage of the RFID device from a radio frequency signal RF received from antenna 10.

Voltage limiter 120 limits power voltage VDD supplied to clock generating unit 160.

Modulator 130 modulates a response signal RP which is received from digital block 200 and is to be transmitted to antenna 10.

Demodulator 140 detects an operating command signal CMD within radio frequency signal RF received from antenna 10 and outputs a command signal CMD to digital block 200. Power-on reset unit 150 senses power voltage VDD provided by voltage multiplier 110 and outputs a power-on reset signal POR to control a reset operation of digital block 200.

Clock generating unit 160 generates a clock CLK. Digital block 200 receives power voltage VDD, power-on reset signal POR, clock signal CLK, and command signal CMD from analog block 100 and outputs response signal RP to analog block 100. Digital block 200 outputs an address ADD, input/output data I/O, and a control signal CTR to memory block 300.

Memory block 300 includes a cell array block 310 including a plurality of memory cells for storing data and a peripheral circuit block 320. Each memory cell of cell array block 310 includes a nonvolatile ferroelectric capacitor, and peripheral circuit block 320 includes a step-pulse pumping unit 330 configured to pump power voltage VDD in response to a pumping enable signal PUMP_EN to generate a high voltage. Step-pulse pumping unit 330 performs a pumping operation during each cycle of a read or write operation.

Pumping enable signal PUMP_EN is a step pulse signal generated from the control signal CTR. For example, control signal CTR may comprise a chip enable signal CE, an output enable signal OE, and a write enable signal WE, and either output enable signal OE or write enable signal WE may result in a pumping enable signal PUMP_EN being generated so that step-pulse pumping unit 330 generates a high voltage.

Figure 2:
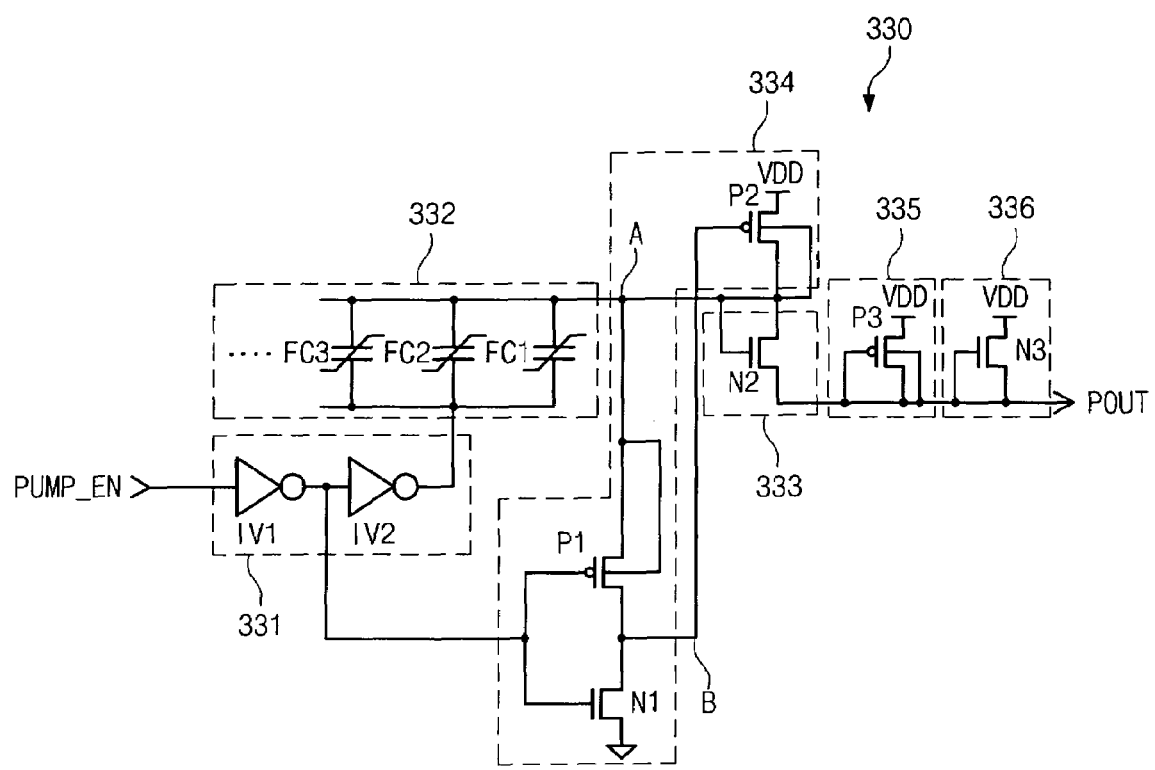
FIG. 2 is a circuit diagram illustrating the step-pulse pumping unit shown in FIG. 1 consistent with an embodiment of the present invention.

FIG. 2 is a circuit diagram of an example of step-pulse pumping unit 330 of FIG. 1.

In FIG. 2, step-pulse pumping unit 330 includes a driving unit 331, a ferroelectric capacitor unit 332, a rectifying unit 333, a first charging unit 334, a second charging unit 335, and an over-pumping sense unit 336.

Driving unit 331 includes inverters IV1 and IV2 each configured to buffer pumping enable signal PUMP_EN and output the buffered signal into ferroelectric capacitor unit 332.

Ferroelectric capacitor unit 332 includes a plurality of ferroelectric capacitors FC1, FC2, and FC3 connected in parallel between a node A and an output terminal of inverter IV2.

Rectifying unit 333 includes an NMOS transistor N2 connected between node A and a pump output terminal POUT. NMOS transistor N2 has a gate connected to node A.

First charging unit 334 includes PMOS transistors P and P2, and an NMOS transistor N1. PMOS transistor P1 and NMOS transistor Ni are serially connected between node A and a ground voltage terminal, and have a common gate to receive an output signal of inverter IV1. A substrate and a source of PMOS transistor P1 are connected to the node A. PMOS transistor P2 has a drain connected to a drain of NMOS transistor N1 at a node B.

Second charging unit 335, which is connected between the power voltage terminal and pump output terminal POUT, includes a PMOS transistor P3 having a gate connected to pump output terminal POUT.

Over-pumping sense unit 336 is connected between the power voltage terminal and pump output terminal POUT, and includes an NMOS transistor N3 having a gate connected to pump output terminal POUT.

Driving unit 331 buffers pumping enable signal PUMP_EN.

Ferroelectric capacitor unit 332 boosts a potential of node A in response to pumping enable signal PUMP_EN transmitted by driving unit 331.

First charging unit 334 charges the voltage of node A to power voltage level VDD depending on a voltage level of node B.

Rectifying unit 333 rectifies the voltage of node A to output the rectified voltage into pump output terminal POUT.

Second charging unit 335 charges a voltage level of pump output terminal POUT to power voltage level VDD.

Over-pumping sense unit 336 transmits an over-pumped voltage into the pump output terminal POUT when the voltage level of pump output terminal POUT is over-pumped over a predetermined voltage level so that the over-pumped voltage is reused as a power voltage used in memory block 300.

Figure 3:
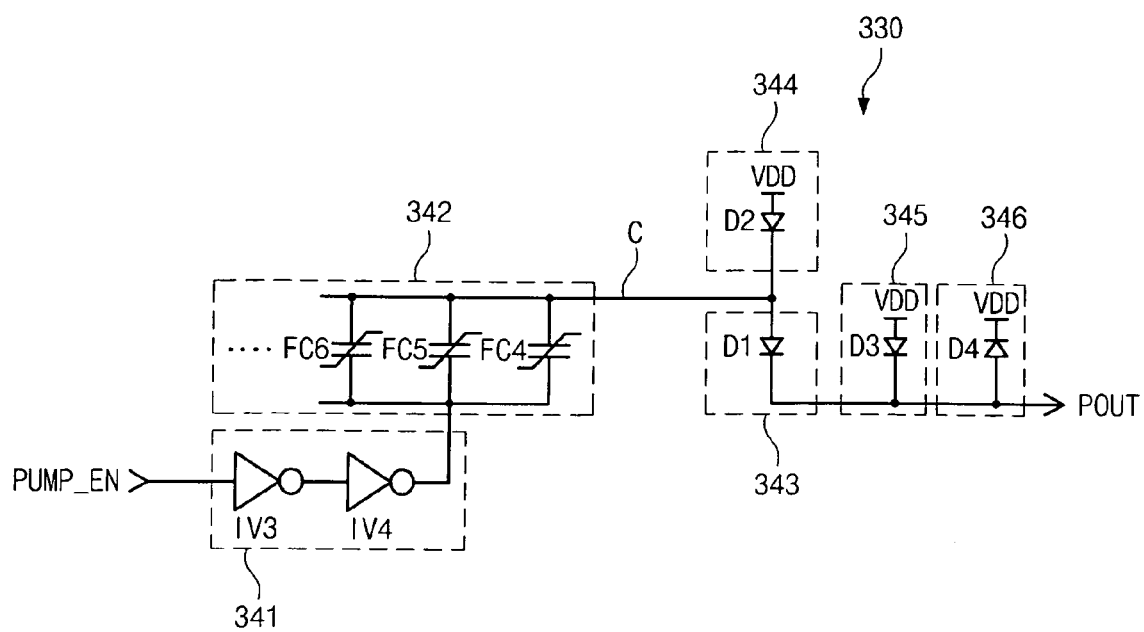
FIG. 3 is a circuit diagram illustrating the step-pulse pumping unit shown in FIG. 1 consistent with another embodiment of the present invention.

FIG. 3 is a circuit diagram of another example of step-pulse pumping unit 330 of FIG. 1, consistent with another embodiment of the present invention.

In FIG. 3, step-pulse pumping unit 330 includes a driving unit 341, a ferroelectric capacitor unit 342, a rectifying unit 343, a third charging unit 344, a fourth charging unit 345, and an over-pumping sense unit 346.

Driving unit 341 includes inverters IV3 and IV4 configured to buffer pumping enable signal PUMP_EN and output the buffered signal to ferroelectric capacitor unit 342.

Ferroelectric capacitor unit 342 includes a plurality of ferroelectric capacitors FC4, FC5, and FC6 connected in parallel between a node C and an output terminal of inverter IV4.

Rectifying unit 343 includes a PN diode D1 connected forward between node C and pump output terminal POUT.

Third charging unit 344 includes a PN diode D2 connected forward, that is, connected such that PN diode D2 has a forward bias, between the power voltage terminal and node C.

Fourth charging unit 345 includes a PN diode D3 connected forward between the power voltage terminal and pump output terminal POUT.

Over-pumping sense unit 346 includes a PN diode D4 connected backward, that is, connected such that PN diode D4 has a reverse bias, between the power voltage terminal and pump output terminal POUT.

Driving unit 341 buffers pumping enable signal PUMP_EN.

Ferroelectric capacitor unit 342 boosts a potential of node C in response to pumping enable signal PUMP_EN transmitted by driving unit 341.

Third charging unit 344 precharges a voltage level of node C up to power voltage level VDD.

Rectifying unit 343 rectifies the voltage of node C to output the rectified voltage to pump output terminal POUT.

Fourth charging unit 345 charges the voltage level of pump output terminal POUT to power voltage level VDD.

Over-pumping sense unit 346 transmits an over-pumped voltage into the power voltage terminal when the voltage level of pump output terminal POUT is over-pumped over a predetermined voltage level so that the over-pumped voltage is reused as a power voltage used in memory block 300.

Figure 4:
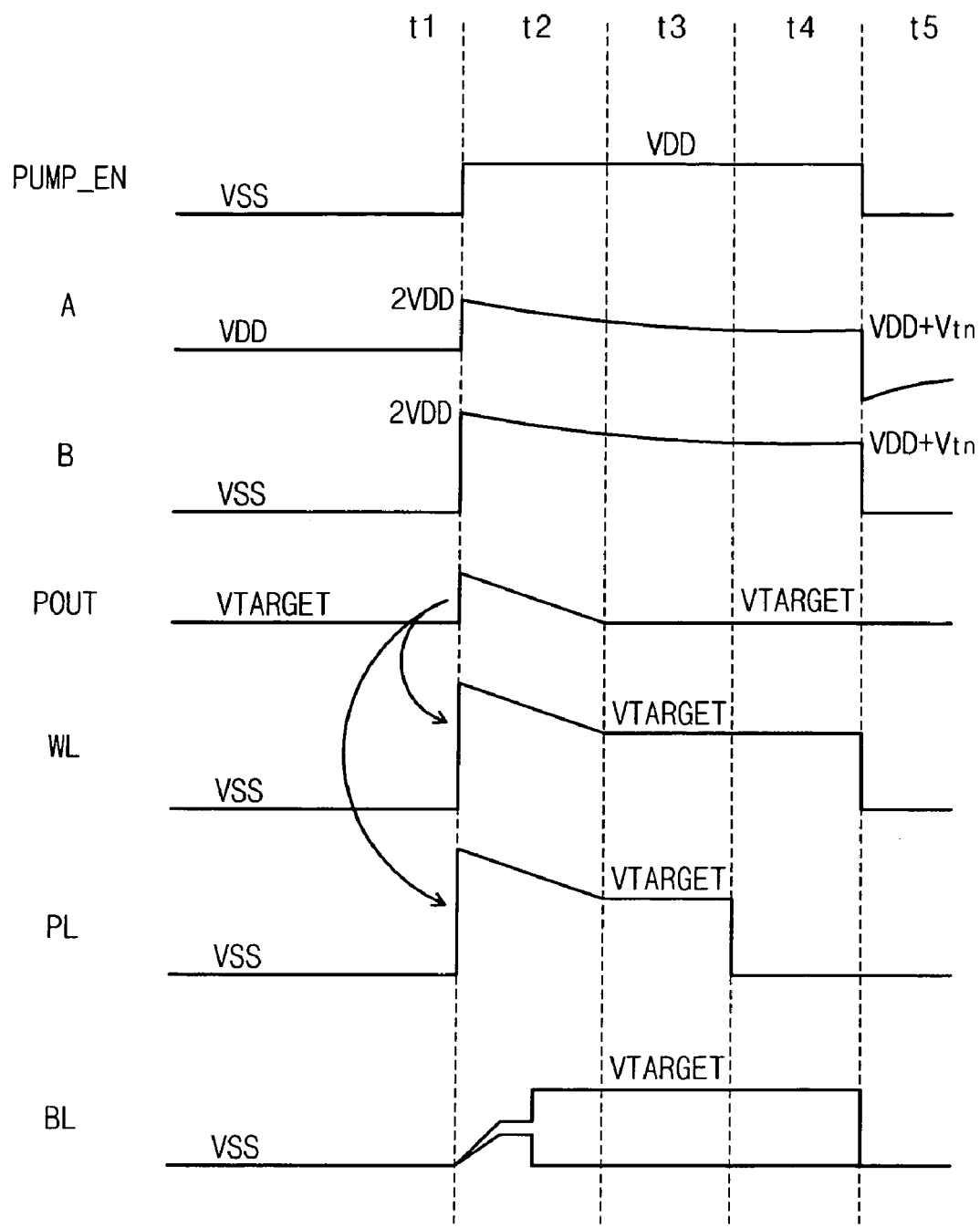
FIG. 4 is a timing diagram illustrating the operation of the step-pulse pumping unit of FIG. 2.

FIG. 4 is a timing diagram illustrating the operation of step-pulse pumping unit 330 of FIG. 2.

In a period t1 where cell array block 310 is not operated, pumping enable signal PUMP_EN is kept at a low voltage level VSS so that node B is kept at low voltage level VSS.

When node B is at low voltage level VSS, node A is charged to the level of power voltage VDD.

When node A is at power voltage level VDD, pump output terminal POUT is kept at a target voltage level VTARGET. When cell array block 310 is not operated, a word line WL, a plate line PL, and a bit line BL are kept at low voltage level VSS.

In a period t2 where memory block 300 performs a sensing operation, pumping enable signal PUMP_EN transitions to power voltage level VDD, and that voltage level of node A increases to a high voltage level 2VDD as a result of the pumping operation performed by ferroelectric capacitor unit 332.

As a result, the voltage level of node B also transitions to approximately 2VDD, effectively turning PMOS transistor P2 of first charging unit 334 off.

When the voltage level of node A goes to high voltage level 2VDD, NMOS transistor N2 is turned on, and voltage level of pump output terminal POUT rises to a voltage level which is higher than that of target voltage VTARGET.

Thereafter, word line WL and plate line PL also rise to a voltage level over that of the target voltage VTARGET so that data stored in cell array block 310 are loaded onto bit line BL. Consistent with an embodiment of the present invention, target voltage VTARGET is a voltage level that may be obtained by subtracting threshold voltages of NMOS transistors N2 and N3 from power voltage level VDD.

Over-pumping sense unit 336 supplies an over-pumped voltage to the power voltage terminal VDD when the voltage level of pump output terminal POUT is over-pumped. The voltage level of pump output terminal POUT is differentiated depending on the threshold voltage Vtn of NMOS transistor N3. That is, the voltage level of pump output terminal POUT is clamped depending on the threshold voltage Vtn of NMOS transistor N3 to regulate a desired voltage level.

In a period t3 where a low level data "0" is restored, the voltage level of pump output terminal POUT remains at target voltage level VTARGET. Word line WL and plate line PL also remain at target voltage level VTARGET.

In a period t4 where a high level data "1" is restored, word line WL is kept at target voltage level VTARGET and plate line PL transitions to low voltage level VSS.

In a period t5 where cell array block 310 finishes a read or write operation, pumping enable signal PUMP_EN transitions to low voltage level VSS, and node B also transitions to low voltage level VSS.

When node B is at low voltage level VSS, node A is charged up to power voltage level VDD by first charging unit 334.

When node A is kept at power voltage level VDD, pump output terminal POUT remains at target voltage VTARGET. When cell array block 310 is not operated, word line WL, plate line PL, and bit line BL remain at low voltage level VSS.

The embodiment of step-pulse pumping unit 330 as shown in FIG. 3 operates similarly to the embodiment of FIG. 2, as discussed above with respect to FIG. 4, and its description is thus omitted.

As described above, a voltage pumping operation is performed only when a cell array block is operated in a memory block of a RFID device consistent with an embodiment of the present invention, thereby reducing power and current consumption. Moreover, a memory cell of the memory block includes a step-pulse pumping unit for supplying a pumping voltage, thereby reducing power consumption.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. An RFID device comprising:
   an analog block configured to receive a radio frequency signal and to output an operation command signal, the radio frequency signal supplying a power voltage having a power voltage level;
   a digital block configured to generate an address and an operating control signal in response to the operation command signal received from the analog block, and to output a response signal corresponding to the operating control signal to the analog block; and
   a memory block including at least one ferroelectric capacitor, the memory block configured to receive the operating control signal to generate an internal control signal and store data in a memory cell in response to the internal control signal,
   wherein the memory block includes a voltage pumping unit configured to supply a pumping voltage higher than the power voltage to the memory cell when the memory cell is operated.

2. The RFID device according to claim 1, wherein the voltage pumping unit performs a pumping operation when the memory block performs a cycle of a read or write operation.

3. The RFID device according to claim 1, wherein the pumping unit comprises:
   a first driving unit configured to buffer a pumping enable signal activated when data of the memory block is to be read or written;
   a ferroelectric capacitor unit including the at least one ferroelectric capacitor configured to pump a first node to a voltage level higher than the power voltage level in response to an output signal of the first driving unit; and
   a first charging unit configured to charge the first node to the power voltage level in response to the pumping enable signal.

4. The RFID device according to claim 3, wherein the first driving unit includes a plurality of inverters each configured to drive the pumping enable signal.

5. The RFID device according to claim 3, wherein the ferroelectric capacitor unit includes a plurality of ferroelectric capacitors connected in parallel between the first driving unit and the first node.

6. The RFID device according to claim 3, wherein the first charging unit includes a MOS transistor connected between the power voltage and the first node, the MOS transistor having a gate which receives the pumping enable signal.

7. The RFID device according to claim 6, further comprising a second driving unit configured to drive the pumping enable signal with a voltage level of the first node to apply the pumping enable signal to the gate of the MOS transistor.

8. The RFID device according to claim 3, further comprising an over-pumping sense unit configured to transmit an over-pumped voltage to an output terminal when the voltage level higher than the power voltage level is over-pumped.

9. The RFID device according to claim 8, wherein the over-pumping sense unit includes a MOS transistor connected between the output terminal and the power voltage, the MOS transistor having a gate connected to the output terminal.

10. The RFID device according to claim 3, further comprising a rectifying unit configured to rectify a voltage of the first node and transmit the rectified voltage to an output terminal.

11. The RFID device according to claim 10, wherein the rectifying unit includes a MOS transistor connected between the first node and the output terminal, the MOS transistor having a gate connected to the first node.

12. The RFID device according to claim 3, further comprising a second charging unit configured to charge an output terminal to the power voltage level.

13. The RFID device according to claim 12, wherein the second charging unit includes a MOS transistor connected between the power voltage and the output terminal, the MOS transistor having a gate connected to the output terminal.

14. The RFID device according to claim 1, wherein the voltage pumping unit comprises:
   a driving unit configured to buffer a pumping enable signal activated when data of the memory block is to be read or written;
   a ferroelectric capacitor unit including the ferroelectric capacitor configured to pump a first node to a voltage level higher than the power voltage level in response to an output signal of the driving unit; and a first charging unit configured to charge the first node to the power voltage level.

15. The RFID device according to claim 14, wherein the driving includes a plurality of inverters each configured to drive the pumping enable signal.

16. The RFID device according to claim 14, wherein the ferroelectric capacitor unit includes a plurality of ferroelectric capacitors each connected between the driving unit and the first node.

17. The RFID device according to claim 14, wherein the first charging unit includes a first diode connected forward between the power voltage and the first node.

18. The RFID device according to claim 14, further comprising an over-pumping sense unit configured to transmit an over-pumped voltage to an output terminal when the voltage level higher than the power voltage level is over-pumped.

19. The RFID device according to claim 18, wherein the over-pumping sense unit includes a second diode connected backward between the output terminal and the power voltage.

20. The RFID device according to claim 14, further comprising a rectifying unit configured to rectify a voltage of the first node and transmit the rectified voltage to an output terminal.

21. The RFID device according to claim 20, wherein the rectifying unit includes a third diode connected forward between the first node and the output terminal.

22. The RFID device according to claim 14, further comprising a second charging unit configured to charge an output terminal to the power voltage level.

23. The RFID device according to claim 22, wherein the second charging unit includes a fourth diode connected forward between the power voltage and the output terminal.

* * * * *